United States Patent [19]

Araki et al.

[11] Patent Number: 4,644,324

[45] Date of Patent: Feb. 17, 1987

[54] DIGITAL TO ANALOG CONVERSION SYSTEM WITH THE ADDITION OF DITHER TO THE DIGITAL INPUT

[75] Inventors: Tetsuro Araki, Hachioji; Hiroyuki Onda, Hoya, both of Japan

[73] Assignee: Teac Corporation, Tokyo, Japan

[21] Appl. No.: 810,974

[22] Filed: Dec. 19, 1985

[30] Foreign Application Priority Data

Dec. 31, 1984 [JP] Japan .................................. 59-277691

[51] Int. Cl.$^4$ ............................................. H03M 1/20
[52] U.S. Cl. ........................ 340/347 DA; 340/347 AD
[58] Field of Search ...................................... 381/29–35; 340/347 DA, 347 CC, 347 AD

[56] References Cited

U.S. PATENT DOCUMENTS

| | | | |
|---|---|---|---|
| 3,508,152 | 4/1970 | Sivertson | 340/347 AD UX |
| 4,346,368 | 8/1982 | Johnson | 340/347 DA |
| 4,490,714 | 12/1984 | Van De Plassche | 340/347 DA |

Primary Examiner—Charles D. Miller

Attorney, Agent, or Firm—Woodcock Washburn Kurtz Mackiewicz & Norris

[57] ABSTRACT

A system for converting an audio or like data signal from digital to analog form, with the addition of dither (white noise) to the digital input, with or without the subsequent removal of the dither from the analog output, for the reduction of quantization noise. Included is a network of n adders, equal in number to the n bits of the coded data signal, for adding in bit parallel form the digital data signal and the digital dither signal. Generated by an analog dither generator, the dither signal is transformed by an analog to digital converter into an m bit coded digital output, m being less than n, prior to delivery to the adder network. Some, preferably all, of the m bits of the digital dither signal are each added to, for example, two different ones of the n bits of the digital data signal so that, for instance, an eight bits analog to digital converter can be used for the provision of a digital dither signal to be added to a 16 bits digital audio signal. The adder network is connected to a digital to analog converter for converting the bit parallel addition of the data and dither signals into analog form.

5 Claims, 1 Drawing Figure

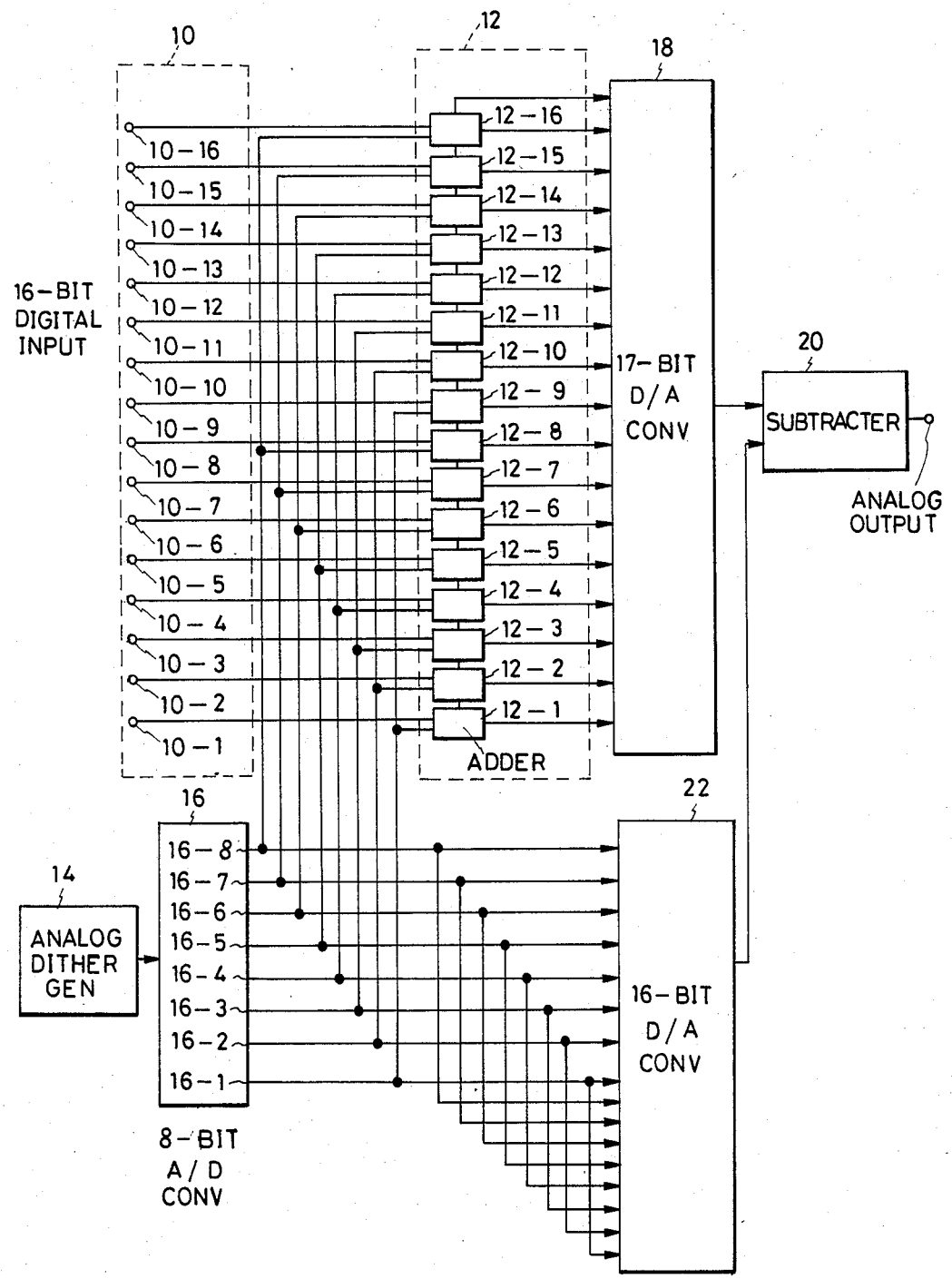

DIGITAL TO ANALOG CONVERSION SYSTEM WITH THE ADDITION OF DITHER TO THE DIGITAL INPUT

BACKGROUND OF THE INVENTION

Our invention relates to a system for the conversion of electric signals from digital to analog form. More specifically, our invention concerns a system for translating a digitized audio signal or like digital data signal into an equivalent analog signal with the addition of dither (an artificially created white noise signal) to the digital data signal, possibly with the subsequent removal of the dither from the analog data signal, for the reduction of noise and distortion.

The pulse code modulation (PCM) or digital processing of audio signals has become, or is becoming, the mainstream of high fidelity sound recording and reproduction with the advent and ever increasing commercial acceptance of compact discs (CDs). There are, however, some problems left unsolved in the area of digital sound processing. One of these is the "quantization noise", by which we mean the differences between the samples of the music wave and the quantized values of the samples. The quantization noise becomes particularly pronounced, distorting the reproduced sound as higher harmonics, when the input signal level is low and there are only a small number of quantization steps. Even when the input signal level is high, the quantization noise will distort the signal if it changes slowly.

A conventional solution to this quantization noise problem has been the use of dither, intended to turn the quantization noise into white noise which hardly affects the appreciation of the reproduced sound. A digital dither signal is superposed on the audio signal prior to its digital to analog conversion and may, may not, be removed from the analog audio signal following the conversion. This technique is disclosed for example in the article entitled "The Application of Large Amplitude Dither to the Quantization of Wide Range Audio Signals" by Yoshio Yamasaki in *The Journal of the Acoustical Society of Japan*, Vol. 39, No. 7, published 1983.

Generated by an analog dither generator, the dither signal must of course be digitized preparatory to its addition to the digital audio signal. Heretofore, if the digitized audio signal is of the 16 bits code, for instance, then the analog dither signal has been digitized by a 16 bits analog to digital converter. Subsequently added to the digital audio signal, the digital dither signal is transformed therewith into analog form by a digital to analog (D/A) converter. We object to the use of the A/D converter having the same number of bits as that of the bits of the digital audio signal for the conversion of the dither from analog to digital form. The cost of the complete digital to analog conversion system will become appreciably lower if there can be employed, for digitizing the analog dither signal, an A/D converter of a smaller bit number than that of the digital audio signal.

SUMMARY OF THE INVENTION

We have hereby found our how to reduce the bit number of an A/D converter for digitizing an analog dither signal, without in any way adversely affecting the effectiveness of the resulting digital dither for the reduction of quantization noise or distortion.

Our invention may be broadly summarized as a system for converting an n bit coded audio or like data signal, where n is a positive integer, from digital to analog form, comprising an analog dither generator, and an A/D converter for converting the analog dither signal generated by the dither generator into an m bit coded digital dither signal, where m is a positive integer less than n. An adder net work is connected both to the A/D converter and to system input means through which is supplied the n bit digital data signal, for adding in bit parallel form the digital dither signal and the digital data signal. The adder network is coupled to the analog to digital converter in such a way that at least some of the m bits of the digital dither signal are each added to more than one of the n bits of the digital data signal, thereby making possible the use of the analog to digital converter having a smaller number of bits than that of the bits of the digital data signal. A D/A converter is coupled to the output of the adder network for converting the bit parallel addition of the data signal and the dither signal from digital to analog form.

Although some or all of the output bits of the A/D converter are each added to more than one bit of the digital data signal, the digital dither signal of a greater bit number thus obtained can nevertheless be thought of as a white noise signal. Thus, in a preferred embodiment, all of the m bits of the A/D converter may each be added to two different ones of the n bits of digital data signal. Accordingly, for a typical 16 bits coded audio signal, there can be employed an eight bits A/D converter, compared with the 16 bits converter used heretofore, thereby affording a corresponding reduction in the cost of the D/A conversion system.

The above and other features and advantages of our invention and the manner of realizing them will become more apparent, and the invention itself will best be understood, from a study of the following description and appended claims, with reference had to the attached drawing showing the preferred embodiment of our invention.

BRIEF DESCRIPTION OF THE DRAWING

The drawing attached herewith is a block diagram of the digital to analog conversion system embodying the principles of our invention.

DESCRIPTION OF THE PREFERRED EMBODIMENT

We will now describe in detail the D/A conversion system of our invention as adapted for use with a 16 bits coded audio signal as an example of data signal that can be handled by the inventive system. At 10 in the accompanying drawing we have indicated the input means of the exemplified D/A conversion system, herein shown to comprise 16 input terminals, designated 10-1 through 10-16, for inputting the 16 bits coded audio signal in bit parallel. The sampling frequency of the incoming digital audio signal may be 88.2 kilohertz.

An adder network 12 comprises sixteen interconnected adders 12-1 through 12-16 for the bit parallel addition of the 16 bits audio signal and a 16 bits digital dither signal to be explained presently. It will be seen that the sixteen input terminals 10-1 through 10-16 are each connected to one of the two inputs of the corresponding one of the adders 12-1 through 12-16.

For the provision of the required 16 bits digital dither signal we provide an analog dither generator 14 and an eight bits A/D converter 16. The dither generator 14 puts out an analog dither signal composed of various frequency components ranging from zero to, say, 300 kilohertz. Connected to the output of this dither generator, the A/D converter 16 transforms the analog dither signal into an eight bits coded digital output, with the bits being produced in parallel. The sampling frequency of the dither signal is the same (e.g. 88.2 kilohertz) as that of the digital audio signal.

The eight bits digital dither signal from the A/D converter 16 must be added in parallel to the 16 bits digital audio signal from the input means 10 by the adder network 12. To this end we suggest, as shown, the connection of each of the eight outputs 16-1 through 16-8 of the A/D converter 16 to two different ones of the adders 12-1 through 12-16. In the illustrated embodiment the first output 16-1 of the A/D converter 16 is connected to both first 12-1 and nineth 12-9 adders, the second output 16-2 connected to both second 12-2 and tenth 12-10 adders, the third output 16-3 to both third 12-3 and eleventh 12-11 adders, and so forth.

Thus, at the adder network 12, the 16 bits of the digital audio signal and the 16 bits (a doubling of the original eight bits) of the digital dither signal are added in parallel by the adders 12-1 through 12-6. The adder network 12 produces a 17 bits addition (including a carry) of the digital audio and dither signals, for delivery to a 17 bits D/A converter 18. This converter convers the dither added audio signal from digital to analog form in the usual manner.

The dither may, or may not, be left added to the audio signal. We have designed this particular D/A conversion system for the removal of the dither following the conversion of the dither added audio signal from digital to analog form. A subtracter network 20 has a first input connected to the D/A converter 18 and a second input to a second D/A converter 22 and thence to the A/D converter 16. The analog dither signal from the second D/A converter 22 should be as closely akin as possible to the analog dither signal contained in the output from the first recited D/A converter 18. For this reason the second D/A converter 22 is of 16 bits construction, and of the eitht outputs 16-1 through 16-8 of the A/D converter 16 are each connected to two different ones of the 16 inputs of the D/A converter 22, the same way as the A/D converter outputs are connected to the adders 12-1 through 12-16. The D/A converter 22 thus provides the desired analog dither signal signal of the desired characteristics, which is used by the subtractor network 20 for removing the dither from the analog dither added audio signal delivered from the D/A converter 18.

We believe that we have made clear how the 16 bits digital dither signal for addition to the 16 bits digitized audio signal can be derived from the eight bits A/D converter. The illustrated embodiment has the additional advantage that the dither contained in the analog output from the D/A converter is in phase with that used for the removal of the dither by the subtracter circuit 20 because the analog dither produced by the generator 14 is not applied directly to the subtractor circuit but via the A/D converter 16 and D/A converter 22. Further, since the dither delivered to the adder network 12 and that delivered to the D/A converter 22 are from the same source, it is possible to remove the dither from the analog dither added audio signal to the maximum possible degree even though the 16 bits dither is created from the the eight bits output of the A/D converter 16.

Although we have shown and described our invention in terms of but one preferable embodiment thereof, we recognize, of course, that our invention could be embodied in other forms within the broad teaching hereof. The following is a brief list of possible modifications, alterations or adaptations of the specific embodiment which we believe fall within the scope of our invention:

1. Not all but some of the output terminals 16-1 through 16-8 of the A/D converter 16 may be each connected to more than one of the adders 12-1 through 12-16. For example, only the four output terminals 16-1 through 16-4 of the A/D converter 16 may each be connected to different two of the adders 12-1 through 12-16, as well as to different two of the input terminals of the D/A converter 22, thereby providing a 12 bits digital dither signal. The bits of the digital dither signal can be smaller in number than that of the digital audio or other data signal.

2. The concepts of this invention are applicable to the D/A conversion system of the type described and claimed in our separate application filed substantially concurrently herewith under the title, "Digital to Analog Conversion Method and System with the Introduction And Later Removal of Dither." That application suggests a system wherein a dither added data signal and a dither signal are fed by time division multiplexing into a common D/A converter thereby to be transformed into analog form, the dither being subsequently removed from the dither added data signal.

3. The dither may not be removed from the data signal.

We claim:

1. A system for converting an n bit coded audio or like data signal, where n is a positive integer, from digital to analog form, comprising:
    (a) input means for receiving the n bit digital data signal;
    (b) a dither generator for generating an analog dither signal;
    (c) an analog to digital converter for converting the analog dither signal into an m bit coded digital dither signal, where m is a positive integer less than n;
    (d) an adder network for adding in bit parallel form the digital data signal and the digital dither signal, the adder network being coupled to the analog to digital converter in such a way that at least some of the m bits of the digital dither signal are each added to more than one of the n bits of the digital data signal, thereby making possible the use of the analog to digital converter having a smaller number of bits than that of the bits of the digital data signal; and
    (e) a digital to analog converter for converting the bit parallel addition of the digital data signal and the digital dither signal into analog form.

2. The digital to analog conversion system of claim 1 further comprising subtracter means for removing the dither signal from the output from the digital to analog converter.

3. The digital to analog conversion system of claim 2 wherein the subtracter means comprises:
    (a) a second digital to analog converter connected to the analog to digital converter for converting the digital dither signal produced by the latter into analog form; and (b) a subtracter circuit having first and second inputs connected respectively to the first recited and to the second digital to analog converter.

4. The digital to analog conversion system of claim 3 wherein the second digital to analog converter is of n bit construction and is connected to the analog to digital converter the same way as the adder network is connected to the analog to digital converter, whereby the same dither signal is input to both the adder network and the second digital to analog converter in order to make possible the optimum removal of the dither signal from the output from the first digital to analog converter by the subtracter circuit.

5. The digital to analog conversion system of claim 1 wherein the adder network is connected to the analog to digital converter in such a way that all of the m bits of the digital dither signal are each added to more than one of the n bits of the digital data signal.

* * * * *